United States Patent
Sakamoto et al.

(10) Patent No.: US 11,900,655 B2
(45) Date of Patent: Feb. 13, 2024

(54) INFORMATION PROCESSING DEVICE, INFORMATION PROCESSING METHOD, AND RECORDING MEDIUM RECORDED WITH INFORMATION PROCESSING PROGRAM

(71) Applicant: TOYOTA JIDOSHA KABUSHIKI KAISHA, Toyota (JP)

(72) Inventors: Hirotaka Sakamoto, Kaisei (JP); Masao Yano, Shizuoka (JP); Tetsuya Shoji, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 218 days.

(21) Appl. No.: 17/480,368

(22) Filed: Sep. 21, 2021

(65) Prior Publication Data

US 2022/0101041 A1  Mar. 31, 2022

(30) Foreign Application Priority Data

Sep. 25, 2020 (JP) ................................ 2020-161483

(51) Int. Cl.
   *G06V 10/75* (2022.01)
   *G06V 20/69* (2022.01)
   *H01J 37/26* (2006.01)

(52) U.S. Cl.
   CPC .......... *G06V 10/758* (2022.01); *G06V 20/695* (2022.01); *H01J 37/26* (2013.01)

(58) Field of Classification Search
   CPC ........................... G06V 10/758; G06V 20/695
   See application file for complete search history.

(56) References Cited

U.S. PATENT DOCUMENTS

| | | | |
|---|---|---|---|
| 2012/0121139 A1* | 5/2012 | Kojima | B41F 33/0036 382/112 |
| 2014/0141237 A1* | 5/2014 | Takeyasu | H01B 1/08 428/336 |
| 2014/0184800 A1* | 7/2014 | Hirai | H01L 27/14621 348/148 |
| 2015/0347866 A1 | 12/2015 | Narumi et al. | |

(Continued)

FOREIGN PATENT DOCUMENTS

| | | |
|---|---|---|
| JP | 2012-202701 A | 10/2012 |
| JP | 2015-226228 A | 12/2015 |

(Continued)

OTHER PUBLICATIONS

HREM Research Inc., "GPA for Digital Micrograph", https://www.hremresearch.com/Eng/download/documents/opa4dm.pdf, Jun. 2017, pp. 1-50.

(Continued)

*Primary Examiner* — Ming Y Hon
(74) *Attorney, Agent, or Firm* — Sughrue Mion, PLLC

(57) ABSTRACT

An information processing device acquires an image captured by a transmission electron microscope. The information processing device, for each partial region in the image, calculates a variation in pixel values of pixels included in the partial region. The information processing device, for each partial region in the image, determines a degree of crystallinity of the partial region based on the calculated variation in the pixel values of the partial region.

8 Claims, 5 Drawing Sheets

(56) References Cited

U.S. PATENT DOCUMENTS

| | | | |
|---|---|---|---|
| 2016/0013397 A1 | 1/2016 | Kitagawa et al. | |
| 2018/0130187 A1 | 5/2018 | Yamasaki | |
| 2018/0336664 A1* | 11/2018 | Ono | H04N 25/63 |
| 2018/0353066 A1* | 12/2018 | Uji | G06T 3/0037 |
| 2019/0023857 A1* | 1/2019 | Shin | B01J 19/125 |
| 2019/0103269 A1* | 4/2019 | Freund | H01L 21/02266 |
| 2020/0381556 A1* | 12/2020 | Yamazaki | H01L 27/1207 |
| 2021/0170695 A1* | 6/2021 | Baba | B29C 66/54 |
| 2021/0313101 A1* | 10/2021 | Yamamoto | H01F 1/15308 |
| 2022/0325077 A1* | 10/2022 | Miyoshi | C08L 23/12 |

FOREIGN PATENT DOCUMENTS

| | | |
|---|---|---|
| JP | 2016-18964 A | 2/2016 |
| JP | 2017-155097 A | 9/2017 |
| WO | 2017/026051 A1 | 2/2017 |

OTHER PUBLICATIONS

Jacob Madsen et al., "A Deep Learning Approach to Identify Local Structures in Atomic-Resolution Transmission Electron Microscopy Images", https://onlinelibrary.wiley.com/doi/abs/10.1002/adts.201800037@10.1002/(ISSN)25130390.MachineLearning, Cont-mat.mtrl-sci, Feb. 9, 2018.

* cited by examiner

INFORMATION PROCESSING DEVICE, INFORMATION PROCESSING METHOD, AND RECORDING MEDIUM RECORDED WITH INFORMATION PROCESSING PROGRAM

CROSS-REFERENCE TO RELATED APPLICATION

This application is based on and claims priority under 35 USC 119 from Japanese Patent Application No. 2020-161483 filed on Sep. 25, 2020, the disclosure of which is incorporated by reference herein.

BACKGROUND

Technical Field

The present disclosure relates to an information processing device, an information processing method, and a recording medium recorded with an information processing program.

Related Art

Technology relating to analysis of images captured using a transmission electron microscope (TEM) (such images are referred to hereafter as TEM images) is known. For example "GPA for Digital Micrograph" (HREM Research Inc., see https://www.hremresearch.com/Eng/download/documents/gpa4dm.pdf) discloses general image analysis technology for TEM images.

Furthermore, "A Deep Learning Approach to Identify Local Structures in Atomic-Resolution Transmission Electron Microscopy Images" (Jacob Madsen et al, see https://onlinelibrary.wiley.com/doi/abs/10.1002/adts.201800037@10.1002/(ISSN)25130390. Machine Learning) discloses technology for using a deep neural network to analyze local structures of substances depicted in TEM images.

In some cases, it is desirable to evaluate the crystallinity of a material depicted in a TEM image. FIG. 7 illustrates an example of TEM images. For example, as illustrated in FIG. 7, patterns such as those depicted in the TEM images IM1, IM2 include locations that are locations of high crystallinity and locations that are locations of low crystallinity.

A conceivable approach when attempting to evaluate the crystallinity of the TEM images IM1, IM2 illustrated in FIG. 7 might be, for example, to evaluate the crystallinity based on brightness values of the images as illustrated in FIG. 8.

However, there are many high crystallinity locations $L_1$ and low crystallinity locations $L_2$ that are locations having substantially the same brightness in a TEM image IM such as that illustrated in FIG. 8, and so crystallinity is not able to be evaluated simply by image brightness values. An image such as the image IMb in FIG. 8 is generated in cases in which thresholding is performed simply on brightness values of the TEM image IM. In the image IMb in FIG. 8, although portions having high brightness values are simply extracted at a pixel unit level, portions of different crystallinity are not extractable at a region unit level.

Accordingly, for example, image analysis such as that disclosed in "GPA for Digital Micrograph" (HREM Research Inc.) is unable on its own to determine the degree of crystallinity of the material depicted in the TEM image.

Furthermore, an attempt to evaluate the crystallinity of the material depicted in a TEM image by employing a neural network or the like, such as that disclosed in "A Deep Learning Approach to Identify Local Structures in Atomic-Resolution Transmission Electron Microscopy Images" (Jacob Madsen et al), would need a large volume of labeled training data to be prepared. The precision of a trained model such as a neural network or the like is dependent on the quality and quantity of such training data. Any attempt to generate a trained model offering high precision relies on the preparation of a large volume of training data, and the preparation thereof takes considerable effort.

As discussed above, the related art in "GPA for Digital Micrograph" (HREM Research Inc.) and "A Deep Learning Approach to Identify Local Structures in Atomic-Resolution Transmission Electron Microscopy Images" (Jacob Madsen et al) is unable to easily determine the crystallinity of a material depicted in a TEM image In consideration of the above circumstances, the present disclosure provides simple determination of the crystallinity of a material depicted in a TEM image.

SUMMARY

An information processing device of a first aspect includes an acquisition section, a calculation section, and a determination section. The acquisition section acquires an image captured by a transmission electron microscope. The calculation section calculates for each partial region in the image acquired by the acquisition section a variation in pixel values of pixels included in the partial region. The determination section determines for each partial region in the image a degree of crystallinity of the partial region based on the variation in the pixel values of the partial region calculated by the calculation section.

An information processing device of a second aspect is one in which the calculation section calculates as the variation a standard deviation of pixel values of the pixels included in each of the partial regions.

An information processing device of a third aspect is one in which the calculation section also calculates the variation for each of the partial regions, each of the partial regions representing an image within a predetermined range centered on a center pixel, and in which the determination section also determines the degree of crystallinity of the partial region by determining a degree of crystallinity of the center pixel in the partial region based on the calculated variation for each of the partial regions. This thereby enables the degree of crystallinity to be determined for each pixel in the image.

An information processing device of a fourth aspect is one further including an image generation section that, based on a determination result by the determination section for each of the center pixels, generates a crystallinity image expressing a degree of crystallinity by applying a discrete pixel value according to the degree of crystallinity of the center pixel. This thereby enables the crystallinity of the material depicted in the TEM image to be visualized.

An information processing device of a fifth aspect is one in which the determination section, based on the calculated variation for each of the partial regions and on a preset value range, further determines the partial region to be a region having a degree of crystallinity corresponding to the value range in cases in which the variation is within the value range.

An information processing method of a sixth aspect is an information processing method for processing executed on a computer. The processing includes acquiring an image captured by a transmission electron microscope, for each partial region in the acquired image, calculating a variation in pixel values of pixels included in the partial region, and for each partial region in the image, determining a degree of crystallinity of the partial region based on the calculated variation in the pixel values of the partial region.

An information processing program of a seventh aspect is an information processing program to cause processing to be executed by a computer. The processing includes acquiring an image captured by a transmission electron microscope, for each partial region in the acquired image calculating a variation in pixel values of pixels included in the partial region, and for each partial region in the image determining a degree of crystallinity of the partial region based on the calculated variation in the pixel values of the partial region.

The present disclosure as described above exhibits the advantageous effect of enabling simple determination of the crystallinity of a material depicted in a TEM image.

DESCRIPTION OF EMBODIMENTS

Exemplary Embodiment

Figure 1:
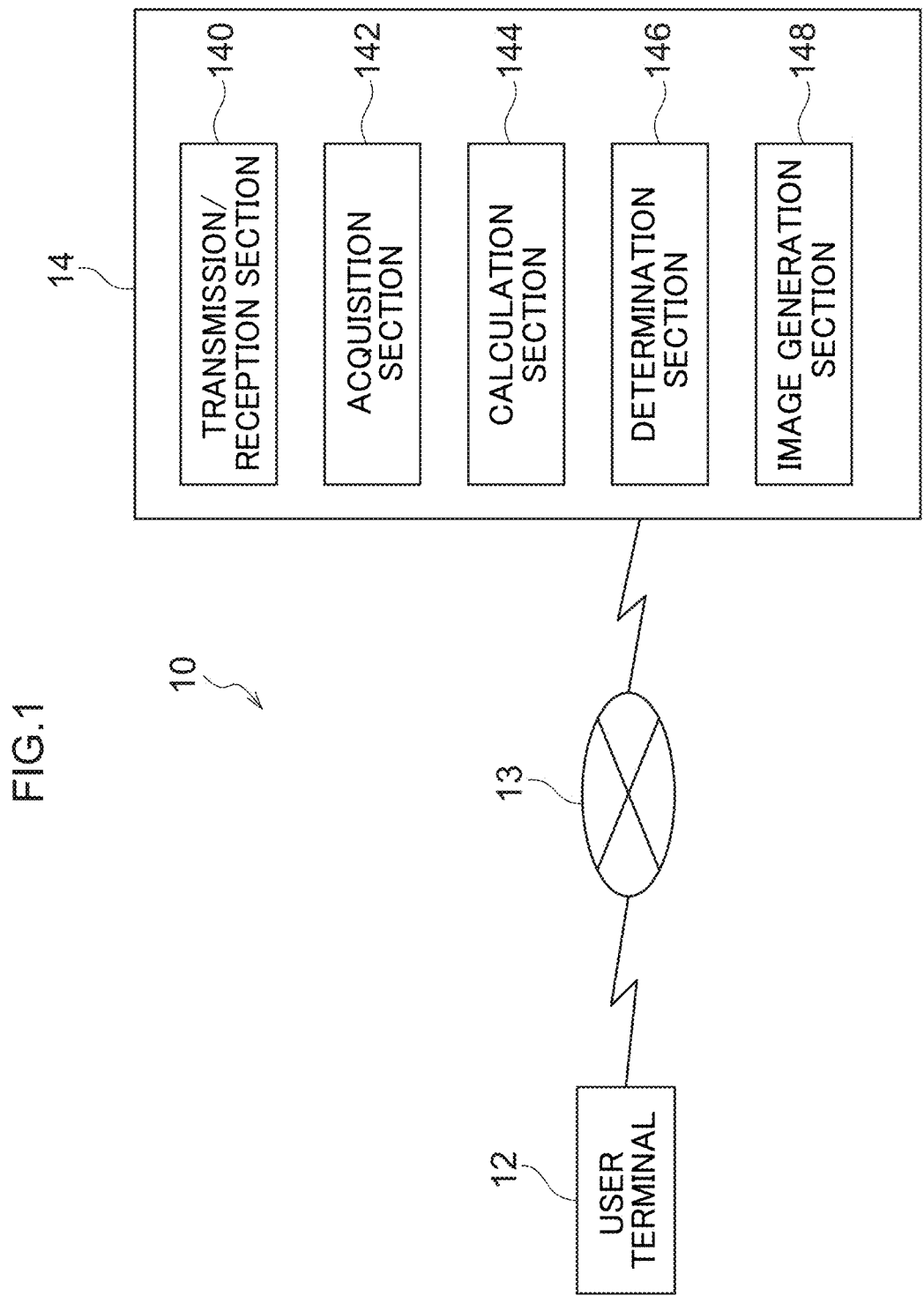
FIG. 1 is a schematic block diagram illustrating an information processing system according to an exemplary embodiment.

FIG. 1 is a block diagram illustrating an example of a functional configuration of an information processing system 10 according to an exemplary embodiment. As illustrated in FIG. 1, the information processing system 10 includes a user terminal 12 and a server 14 serving as an example of an information processing device. The user terminal 12 and the server 14 are, for example, connected together over a network 13 such as the internet.

The information processing system 10 according to the present exemplary embodiment is configured to analyze a TEM image, namely an image captured by a transmission electron microscope, and to determine the crystallinity of a material depicted in the TEM image. Specifically, the server 14 of the information processing system 10 calculates variation in pixel values of pixels included in each partial region in a TEM image transmitted from the user terminal 12 in order to determine a degree of crystallinity of the partial region based on the variation. This enables simple determination of the crystallinity of a material depicted in the TEM image.

Specific explanation follows regarding the above.

User Terminal

A user inputs a TEM image of an analysis subject material into the user-operated user terminal 12. The TEM image is an image of the material captured using a transmission electron microscope.

The user terminal 12 transmits the TEM image input by the user to the server 14 over the network 13. The TEM image transmitted from the user terminal 12 is analyzed by the server 14, described below.

Server

As illustrated in FIG. 1, the server 14 includes a transmission/reception section 140, an acquisition section 142, a calculation section 144, a determination section 146, and an image generation section 148.

The transmission/reception section 140 receives the TEM image transmitted from the user terminal 12.

The acquisition section 142 acquires the TEM image received by the transmission/reception section 140.

Figure 2:
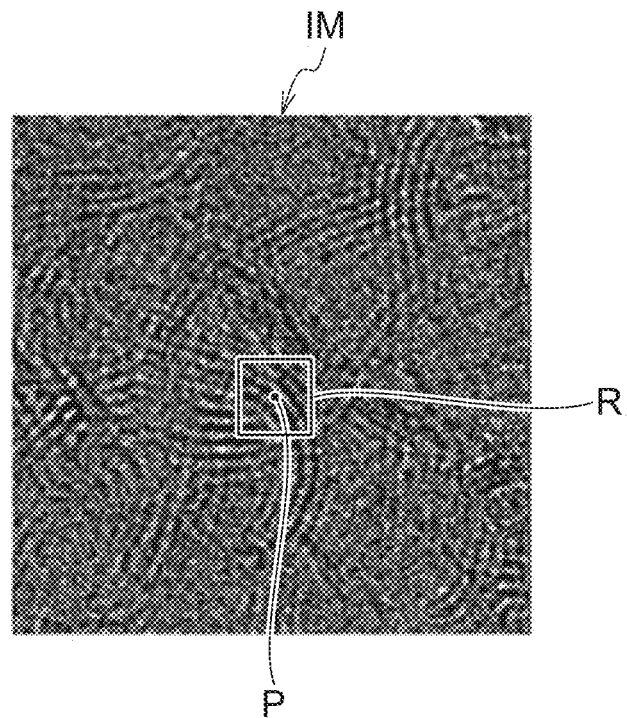
FIG. 2 is a diagram to explain a partial region in a TEM image.

For each of the partial regions in the TEM image acquired by the acquisition section 142, the calculation section 144 calculates variation in pixel values of pixels included in the partial region. FIG. 2 is a diagram to explain the partial regions in a TEM image.

Specifically, as illustrated in FIG. 2, the calculation section 144 sets plural partial regions R in a TEM image IM, with each partial region R representing an image within a predetermined range centered on a center pixel P. For example, the calculation section 144 sequentially sets each of the partial regions R by setting each pixel configuring the TEM image IM as the center pixel P. For each of the plural partial regions, the calculation section 144 then calculates standard deviation of pixel values, this being an example of variation in pixel values of pixels included in the partial region.

Figure 3:
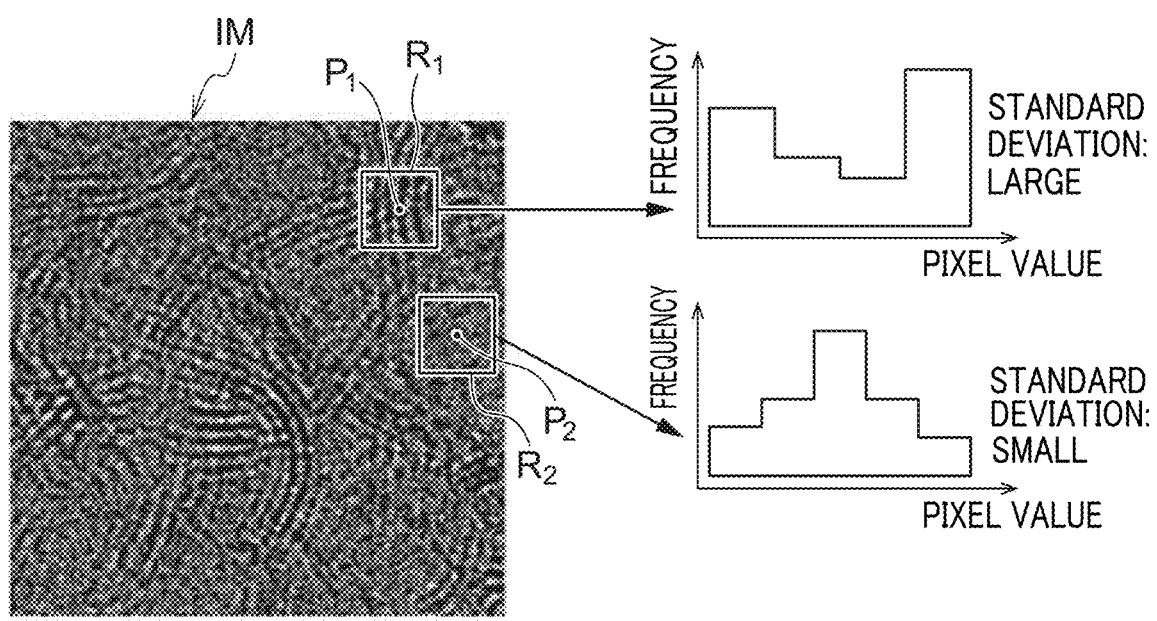
FIG. 3 is a diagram to explain a relationship between standard deviation of pixel values of pixels included in a partial region and a degree of crystallinity.

FIG. 3 is a diagram for explaining a relationship between the standard deviation of pixel values of pixels included in a partial region and the degree of crystallinity. As illustrated in FIG. 3, in the TEM image IM, a partial region $R_1$ centered on a center pixel $P_1$ corresponds to a location of high crystallinity. As is also illustrated in FIG. 3, in the TEM image IM, a partial region $R_2$ centered on a center pixel $P_2$ corresponds to a location of low crystallinity. As illustrated in FIG. 3, when graphs are generated with pixel values on the horizontal axis and frequency of the pixel values on the vertical axis, the pixel values of pixels included in the partial region $R_1$ have a large standard deviation, whereas the pixel values of pixels included in the partial region $R_2$ have a small standard deviation.

For each of the plural partial regions, the determination section 146 determines whether or not the center pixel of the partial region is a high crystallinity pixel based on the standard deviation of the partial region as calculated by the calculation section 144. Determination as to whether or not each of the partial regions is a region of high crystallinity is performed in this manner.

Specifically, for each of the plural partial regions, based on the standard deviation of the partial region and a preset threshold, the determination section 146 determines the center pixel of the partial region to be in a region of high crystallinity in cases in which the standard deviation is larger than the threshold. The determination section 146 determines the center pixel of the partial region to not be in a region of high crystallinity in cases in which the standard deviation is the threshold or below.

Based on results of determination by the determination section 146, the image generation section 148 applies discrete pixel values according to the degree of crystallinity of the center pixel so as to generate a crystallinity image expressing the degree of crystallinity. Specifically, in cases in which the crystallinity of the center pixel has been determined to be high, the image generation section 148 applies a first pixel value (for example a pixel value expressing white) to the pixel at the position corresponding to the center pixel. In cases in which a crystallinity of a center pixel has been determined to be low based on the results of determination by the determination section 146, the image generation section 148 applies a second pixel value (for example a pixel value expressing black) to the pixel at the position corresponding to the center pixel. In this manner, the image generation section 148 generates a crystallinity image expressing the degree of crystallinity.

Figure 4:
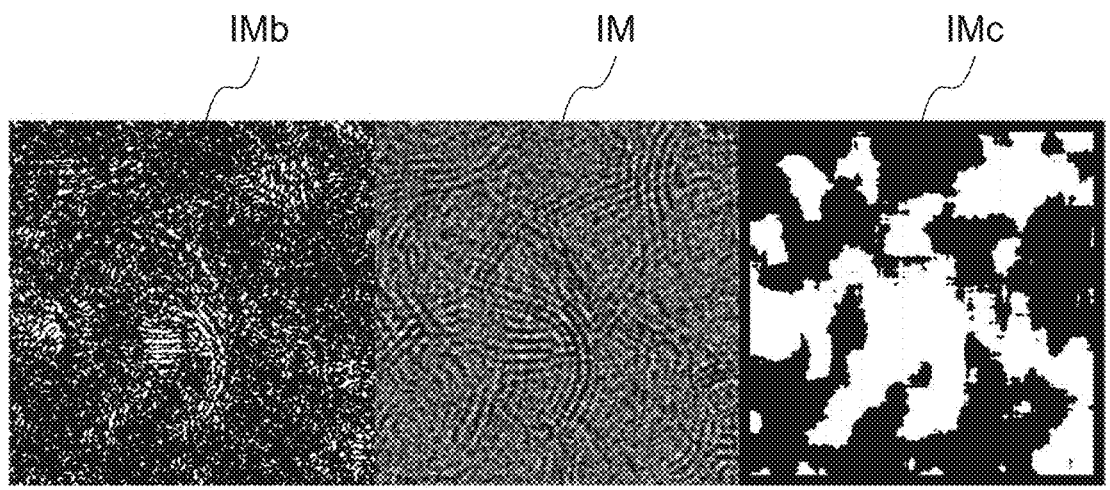
FIG. 4 is a diagram illustrating an example of crystallinity images.

FIG. 4 illustrates an example of the TEM image IM, a crystallinity image IMb generated using related technology, and a crystallinity image IMc generated by the processing of the server 14 of the present exemplary embodiment. The crystallinity image IMb generated using related technology is an image obtained by thresholding brightness values of an image to evaluate crystallinity.

In the crystallinity image IMc generated by the processing of the server 14 of the present exemplary embodiment, white is applied in cases in which the crystallinity of the center pixel is determined to be high, and black is applied in cases in which the crystallinity of the center pixel is determined to be low. As illustrated in FIG. 4, the crystallinity image IMb obtained using a related method is an image obtained by thresholding based simply on pixel values, and although locations of high crystallinity are extractable at a pixel unit level, such locations are not extractable at a region unit level. By contrast, it can be seen that in the crystallinity image IMc locations of high crystallinity are extractable with good precision at the region unit level.

The transmission/reception section 140 transmits the crystallinity image generated by the image generation section 148 to the user terminal 12.

The user terminal 12 receives the crystallinity image transmitted from the server 14. The user then checks the crystallinity image displayed on a display section of the user terminal 12.

Figure 5:
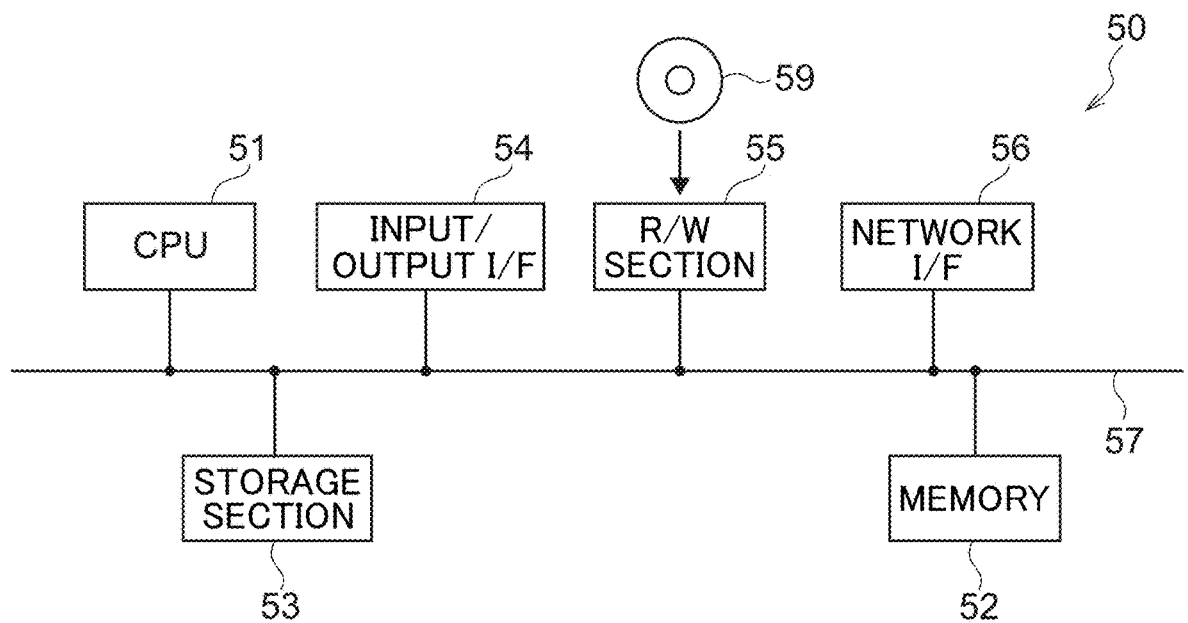
FIG. 5 is a diagram illustrating an example of a configuration of a computer of a user terminal and of a server according to an exemplary embodiment.

The user terminal 12 and the server 14 may be implemented by a computer 50 such as that illustrated in FIG. 5. The computer 50 implementing the user terminal 12 and the server 14 includes a CPU 51, memory 52 serving as a temporarily storage region, and a non-volatile storage section 53. The computer further includes an input/output interface (I/F) 54 to which an input/output device or the like (not illustrated in the drawings) is connected, and a read/write (R/W) section 55 that controls reading and writing of data with respect to a recording medium 59. The computer further includes a network I/F 56 connected to a network such as the internet. The CPU 51, the memory 52, the storage section 53, the input/output I/F 54, the R/W section 55, and the network I/F 56 are connected together through a bus 57.

The storage section 53 may be implemented by a hard disk drive (HDD), a solid state drive (SSD), flash memory, or the like. The storage section 53 that serves as a storage medium is stored with a program to cause a computer to function. The CPU 51 reads the program from the storage section 53 and expands the program in the memory 52, and processes of the program are executed in sequence.

Next, explanation follows regarding operation of the information processing system 10 of the present exemplary embodiment.

Figure 6:
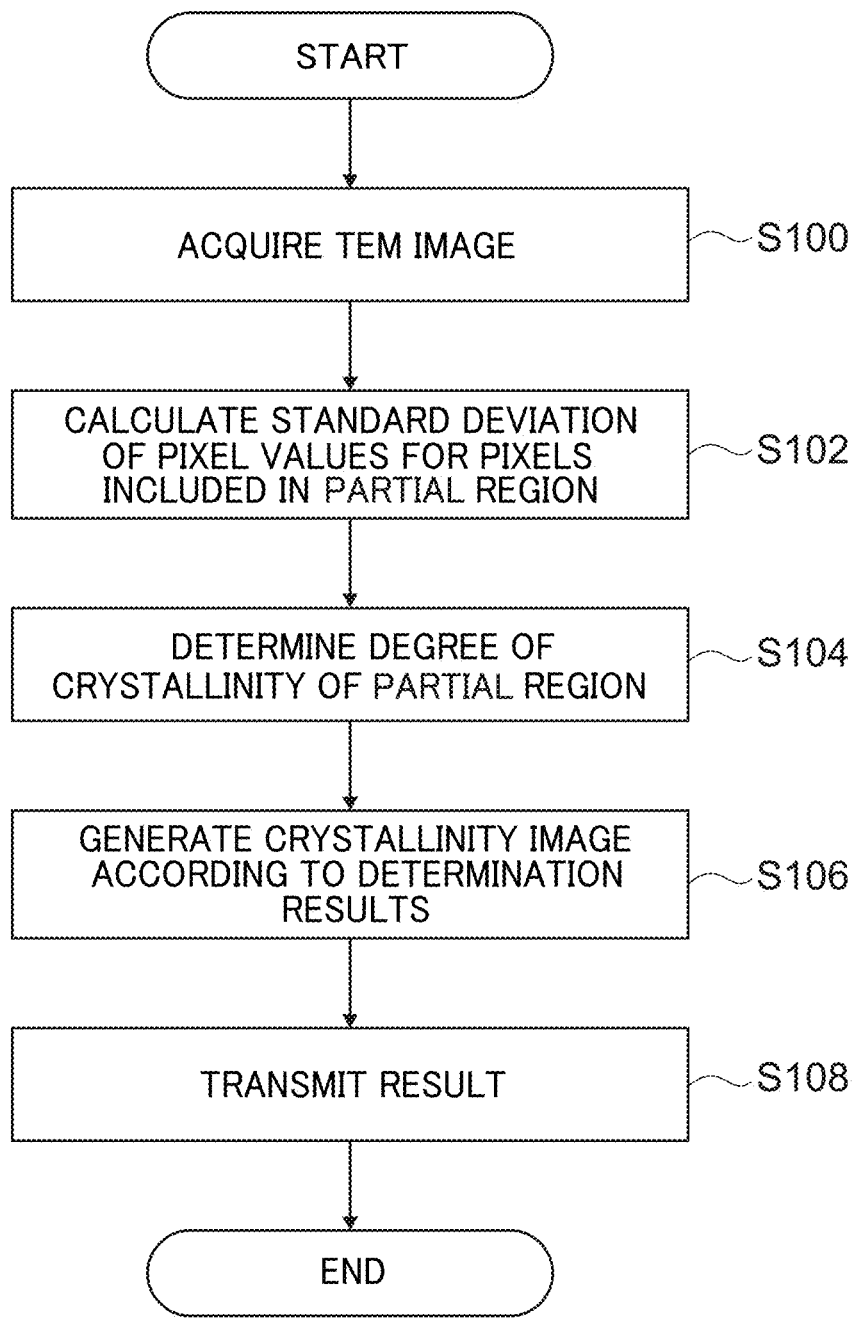
FIG. 6 is a flowchart illustrating an example of information processing performed by a server according to an exemplary embodiment.
Figure 7:
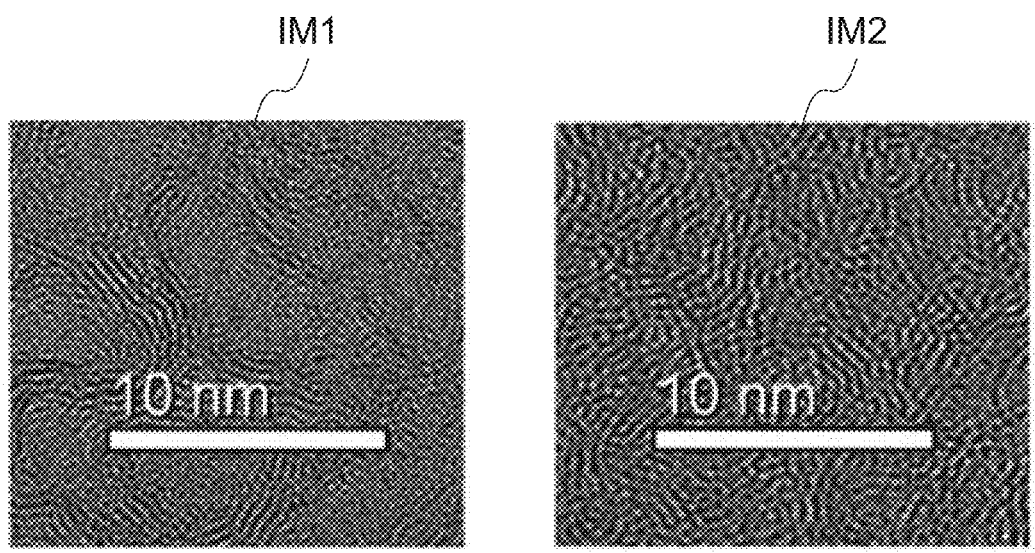
FIG. 7 is a diagram illustrating examples of TEM images.
Figure 8:
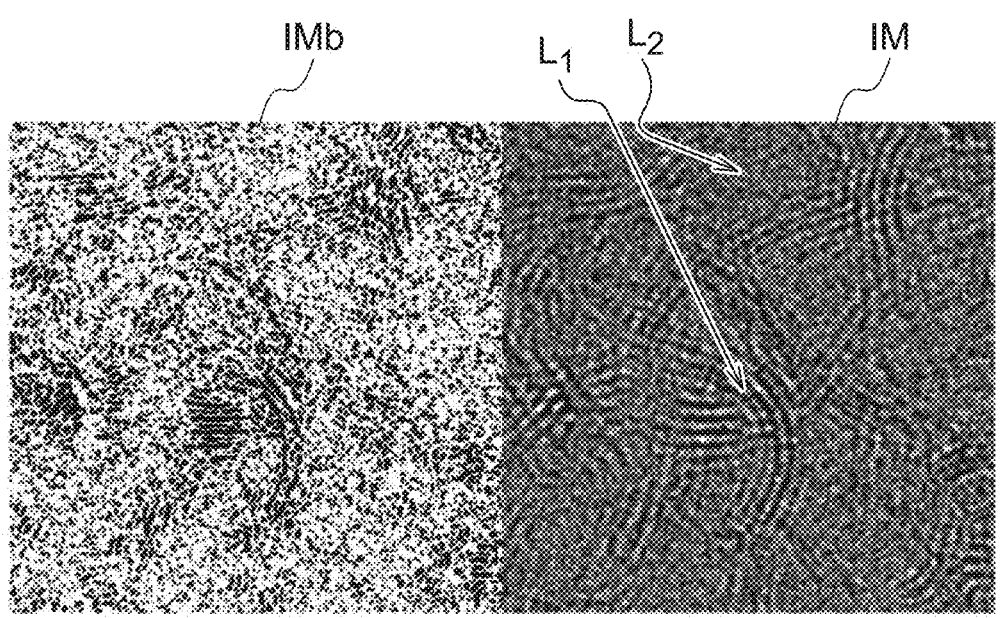
FIG. 8 is a diagram illustrating an example of an image obtained by performing thresholding on a TEM image.

On input of a TEM image to the user terminal 12, the user terminal 12 transmits the TEM image to the server 14. On receipt of the TEM image by the server 14, the server 14 executes the information processing routine illustrated in FIG. 6.

At step S100, the CPU 51 functions as the acquisition section 142 to acquire the TEM image received by the transmission/reception section 140.

At step S102, for each of the partial regions in the TEM image acquired at step S100, the CPU 51 functions as the calculation section 144 to calculate the standard deviation of pixel values of pixels included in the partial region.

At step S104, for each of the plural partial regions, the CPU 51 functions as the determination section 146 to determine the degree of crystallinity of the center pixel of the partial region based on the standard deviation of the partial region as calculated at step S102.

At step S106, based on the determination results obtained at step S104, the CPU 51 functions as the image generation section 148 to apply the first pixel value (for example a pixel value expressing white) to pixels at positions corresponding to the center pixel in cases in which the crystallinity of center pixel has been determined to be high, and to apply the second pixel value (for example a pixel value expressing black) to pixels at positions corresponding to the center pixel in cases in which the crystallinity of the center pixel has been determined to be low, and to thereby generate a crystallinity image expressing the degree of crystallinity.

At step S108, the CPU 51 functions as the transmission/reception section 140 to transmit the crystallinity image generated as a result of step S106 to the user terminal 12.

As described above, for each partial region in a TEM image, this being an image captured by a transmission electron microscope, the server 14 of the information processing system 10 according to the present exemplary embodiment calculates variation in pixel values of pixels included in the partial region. For each of the plural partial regions, the server 14 then determines the degree of crystallinity of the partial region based on the variation in pixel values of pixels included in the partial region. This enables simple determination of the crystallinity of a material depicted in the TEM image. Since a trained model such as a neural network is not required, the crystallinity of the respective partial regions in a TEM image can be determined without preparing labeled training data. Moreover, the degree of crystallinity can be more precisely determined than in cases that simply utilize brightness values and a threshold.

Note that although explanation has been given regarding an example in which the processing performed by the respective devices of the exemplary embodiment described above is software processing performed by executing a program, this processing may be performed by hardware. Alternatively, the processing may performed by a combination of software and hardware. The program stored in the ROM may be distributed in a format stored on various storage media.

The present disclosure is not limited to the above explanation, and obviously various other modifications may be implemented within a range not departing from the spirit of the present disclosure.

For example, although a case has been described in which standard deviation is calculated as an example of variation in pixel values of pixels in a partial region in a TEM image in the exemplary embodiment described above, there is no limitation thereto. Variation in pixel values of pixels in a partial region may be evaluated by another index.

In the exemplary embodiment described above, an example has been described in which, based on the standard deviation of each of the partial regions and the threshold, the determination section 146 determines the center pixel in a partial region to be in a high crystallinity region in cases in which the standard deviation of the partial region is greater than the threshold, and determines the center pixel in a partial region to be in a low crystallinity region in cases in which the standard deviation of the partial region is the threshold or below. However, there is no limitation thereto. For example, the determination section 146 may determine the degree of crystallinity based on the standard deviation of the partial region and on a preset value range. Specifically, in cases in which the standard deviation of a partial region is within the value range, the determination section 146 may determine the partial region to be a region of degree of crystallinity corresponding to the value range. For example, in cases in which the standard deviation of a partial region is in a value range from T1 to T2, the determination section 146 determines the crystallinity of the center pixel in this partial region to be in a region with a degree of crystallinity C (or from C1 to C2) corresponding to the value range from T1 to T2. This enables the degree of crystallinity to be evaluated continuously rather than simply as high or low crystallinity.

All publications, patent applications, and technical standards mentioned in this specification are herein incorporated by reference to the same extent as if each individual publication, patent application, or technical standard was specifically and individually indicated to be incorporated by reference.

The invention claimed is:

1. An information processing device comprising:
    a memory; and
    a processor coupled to the memory, the processor being configured to:
    acquire an image captured by a transmission electron microscope;
    for each partial region in the image, calculate a variation in pixel values of pixels included in the partial region; and
    for each partial region in the image, determine a degree of crystallinity of the partial region based on the calculated variation in the pixel values of the partial region, wherein:
    in a case of calculating the variation in pixel values, the processor is further configured to calculate the variation for each of the partial regions, each of the partial regions representing an image within a predetermined range centered on a center pixel; and
    in a case of determining the degree of crystallinity of each of the partial regions, the processor is further configured to determine the degree of crystallinity of the partial region by determining a degree of crystallinity of the center pixel in the partial region based on the calculated variation for each of the partial regions.

2. The information processing device of claim 1, wherein the processor is further configured to calculate, as the variation, a standard deviation of pixel values of the pixels included in each of the partial regions.

3. The information processing device of claim 1, wherein, based on a determination result for each of the center pixels, the processor is further configured to generate a crystallinity image expressing a degree of crystallinity, by applying a discrete pixel value according to the degree of crystallinity of the center pixel.

4. The information processing device of claim 1, wherein, based on the calculated variation for each of the partial regions and on a preset value range, the processor is further configured to determine the partial region to be a region having a degree of crystallinity corresponding to the value range in a case in which the variation is within the value range.

5. An information processing method in which a processor executes processing, the processing comprising:
    acquiring an image captured by a transmission electron microscope;
    for each partial region in the image, calculating a variation in pixel values of pixels included in the partial region; and
    for each partial region in the image, determining a degree of crystallinity of the partial region based on the calculated variation in the pixel values of the partial region, wherein:
    in a case of calculating the variation in pixel values, the processor is further configured to calculate the variation for each of the partial regions, each of the partial regions representing an image within a predetermined range centered on a center pixel; and
    in a case of determining the degree of crystallinity of each of the partial regions, the processor is further configured to determine the degree of crystallinity of the partial region by determining a degree of crystallinity of the center pixel in the partial region based on the calculated variation for each of the partial regions.

6. A non-transitory recording medium recorded with an information processing program executable by a processor to perform processing, the processing comprising:
    acquiring an image captured by a transmission electron microscope;
    for each partial region in the image, calculating a variation in pixel values of pixels included in the partial region; and
    for each partial region in the image, determining a degree of crystallinity of the partial region based on the calculated variation in the pixel values of the partial region, wherein:
    in a case of calculating the variation in pixel values, the processor is further configured to calculate the variation for each of the partial regions, each of the partial regions representing an image within a predetermined range centered on a center pixel; and
    in a case of determining the degree of crystallinity of each of the partial regions, the processor is further configured to determine the degree of crystallinity of the partial region by determining a degree of crystallinity of the center pixel in the partial region based on the calculated variation for each of the partial regions.

7. The information processing method of claim 5, wherein, based on a determination result for each of the center pixels, the processor is further configured to generate a crystallinity image expressing a degree of crystallinity, by applying a discrete pixel value according to the degree of crystallinity of the center pixel.

8. The non-transitory recording medium of claim 6, wherein, based on a determination result for each of the center pixels, the processor is further configured to generate a crystallinity image expressing a degree of crystallinity, by applying a discrete pixel value according to the degree of crystallinity of the center pixel.

* * * * *